United States Patent [19]

Henley et al.

[11] Patent Number: 4,875,006
[45] Date of Patent: Oct. 17, 1989

[54] ULTRA-HIGH-SPEED DIGITAL TEST SYSTEM USING ELECTRO-OPTIC SIGNAL SAMPLING

[75] Inventors: Francois G. Henley, San Jose; Hee-June Choi, Fremont; Dean J. Kratzer, Palo Alto; Maurice R. Barr, Saratoga, all of Calif.

[73] Assignee: Photon Dynamics, Inc., San Jose, Calif.

[21] Appl. No.: 239,577

[22] Filed: Sep. 1, 1988

[51] Int. Cl.$^4$ .................. G01R 19/00; G01R 5/28
[52] U.S. Cl. ................. 324/158 R; 324/158 D; 324/158 F; 324/73 PC; 324/96
[58] Field of Search .......... 324/158 R, 158 F, 73 PC, 324/73 AT, 77 K; 356/243, 244, 239, 398, 367, 368; 350/390, 331; 437/8

[56] References Cited

U.S. PATENT DOCUMENTS

| | | | |
|---|---|---|---|
| 3,614,451 | 10/1971 | Gunn | 250/217 |
| 4,269,483 | 5/1981 | Feldtkeller | 324/96 X |
| 4,446,425 | 5/1984 | Valdmanis et al. | 324/96 X |
| 4,646,299 | 2/1987 | Schinabeck et al. | 324/73 R X |
| 4,681,449 | 7/1987 | Bloom et al. | 356/364 |

OTHER PUBLICATIONS

Yariv; "The Modulation of Optical Radiation", Quantum Electronics, 1975; pp. 327-351.

Primary Examiner—Reinhard J. Eisenzopf
Assistant Examiner—Vinh P. Nguyen
Attorney, Agent, or Firm—Flehr, Hohbach, Test, Albritton and Herbert

[57] ABSTRACT

A high-speed test system for semiconductor integrated circuits utilizes electro-optic sampling techniques to perform tests at data rates up to 1.2 Gb/s. The receiver portion of the tester has a 4.5 GHz bandwidth and can perform ECL level functional test with one sampling pulse per vector. A device under test is positioned in a test head with an electro-optic birefringent crystal sensor positioned below the device under test to minimize signal path length. A system control unit includes a Nd: YAG modelocked laser which generates optical pulses, and optical transmission means directs the optical pulses to an array of reflective contacts on the sensor. The sensor functions as a Pockels cell with the electric field in the crystal sensor due to voltages on the array of contacts changing the transmission of polarized light through the crystal. Reflected pulses are received and converted to electrical signals indicative of the voltages on the array of contacts on the electro-optic sensor.

8 Claims, 8 Drawing Sheets

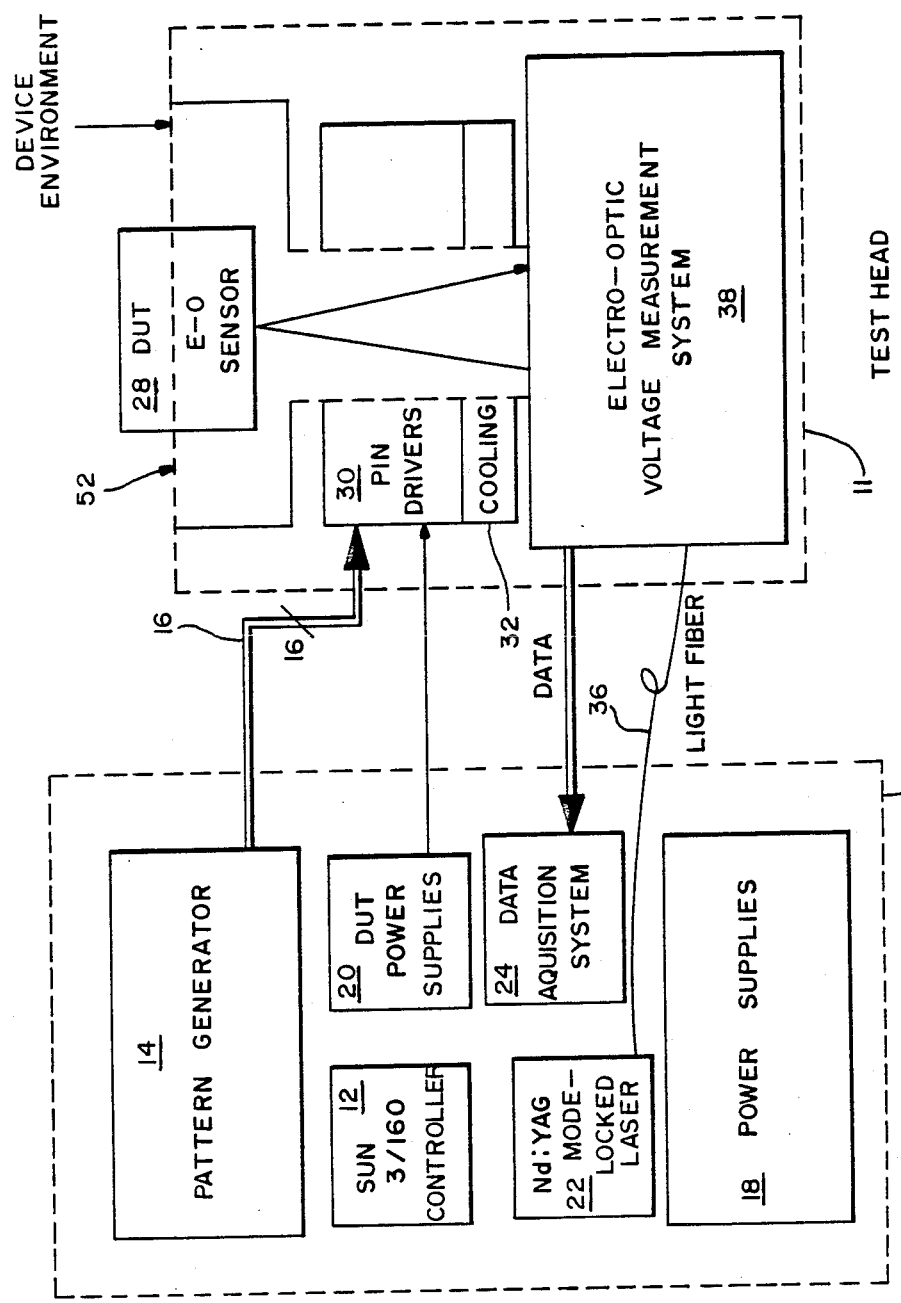
FIG.—1

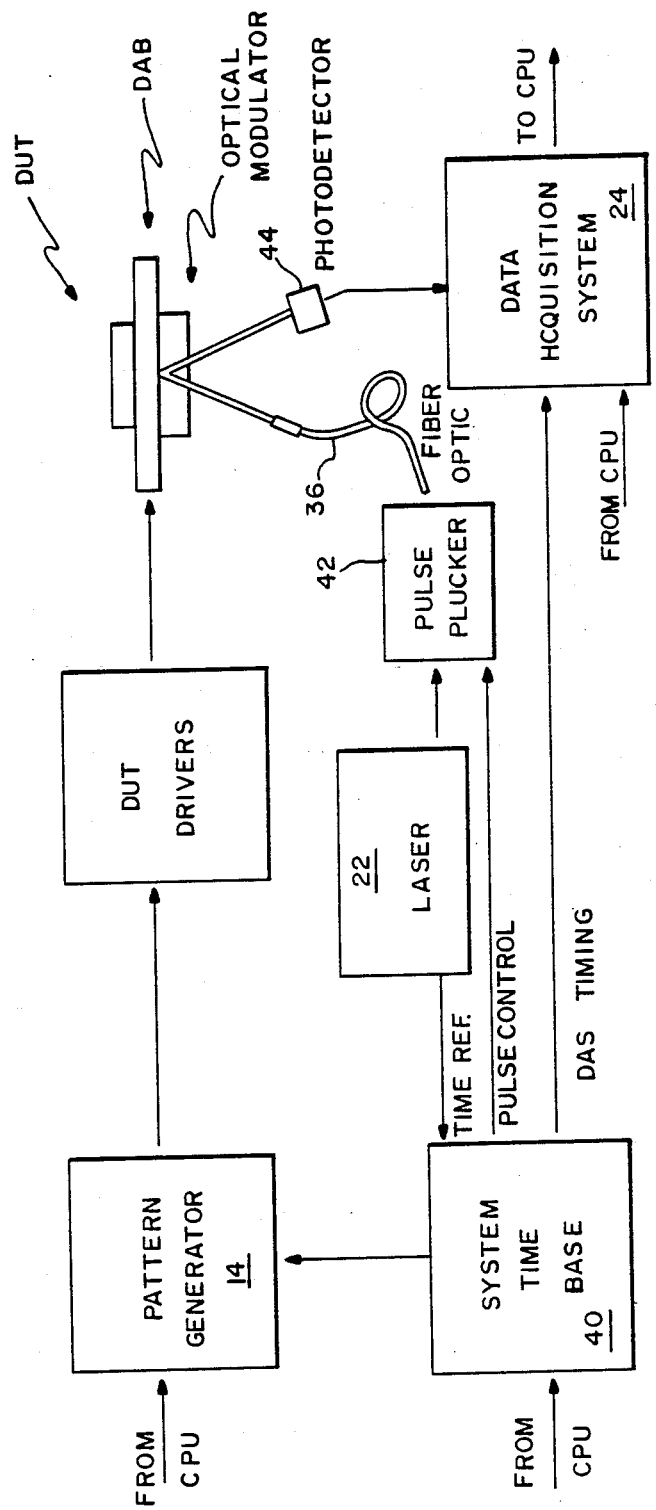
FIG.—2

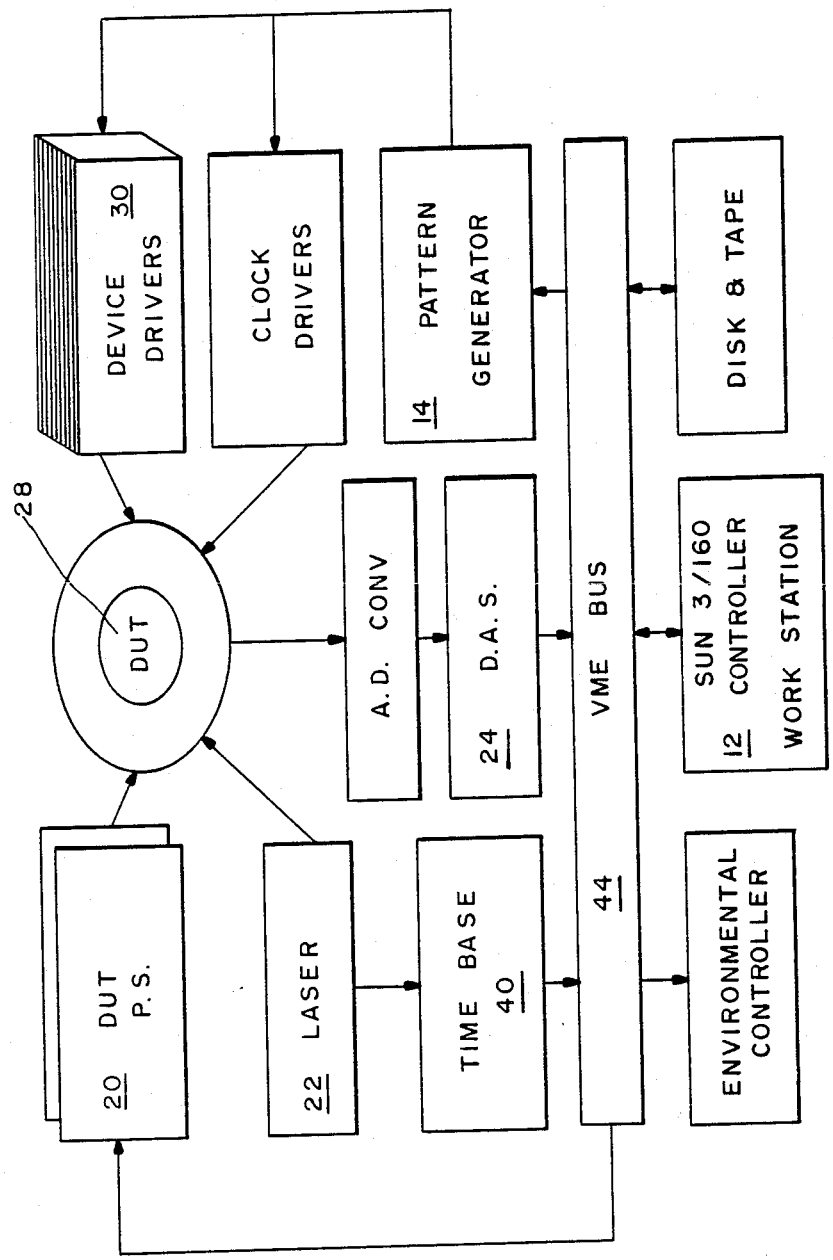
FIG.—3

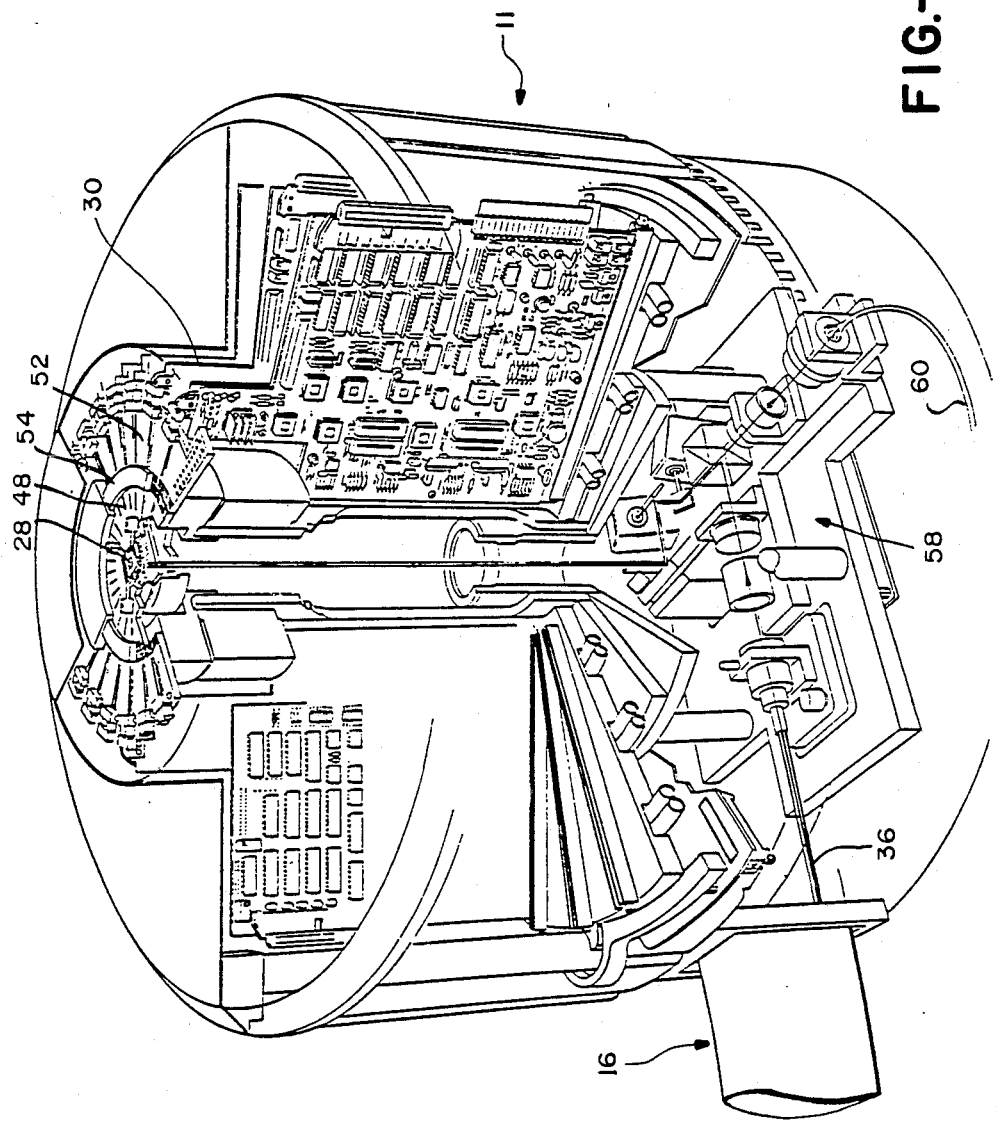
FIG.—4

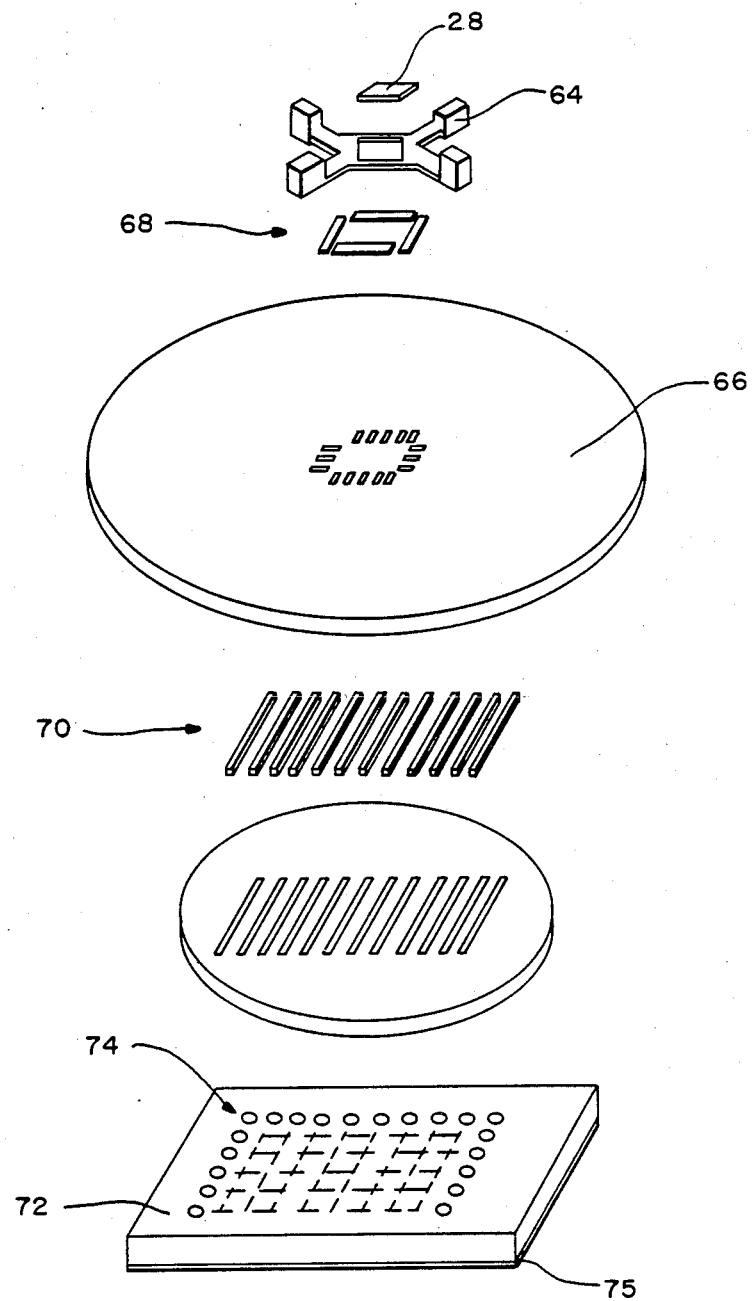
FIG.—5A

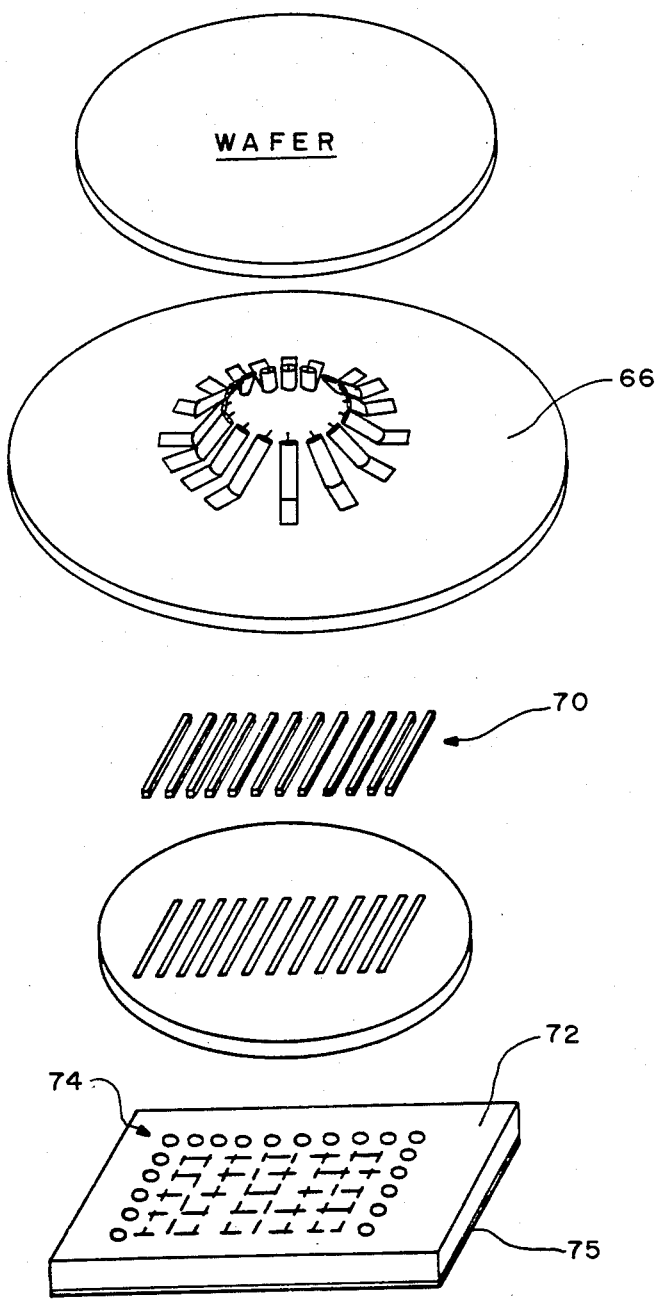
FIG.—5B

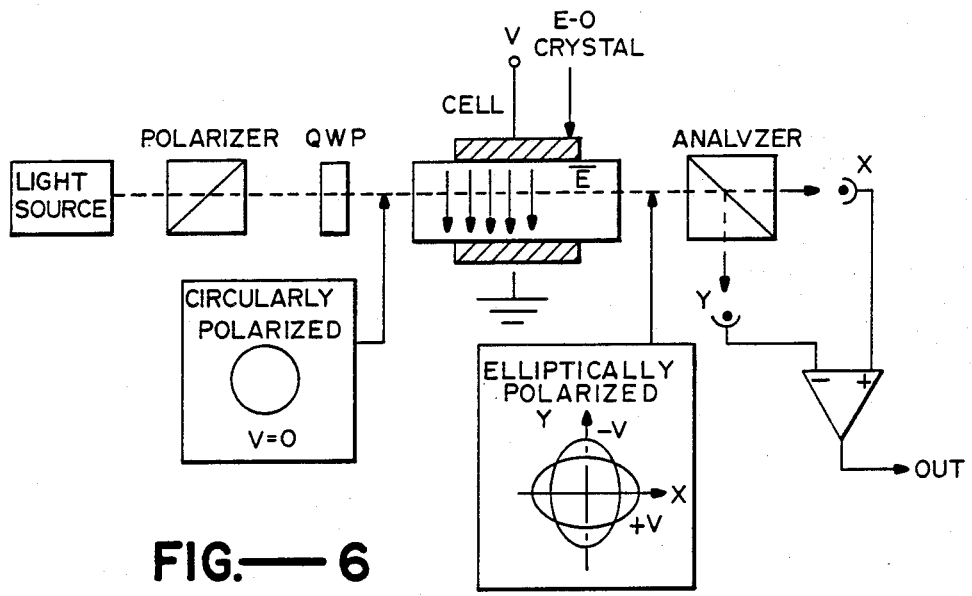
FIG.—6
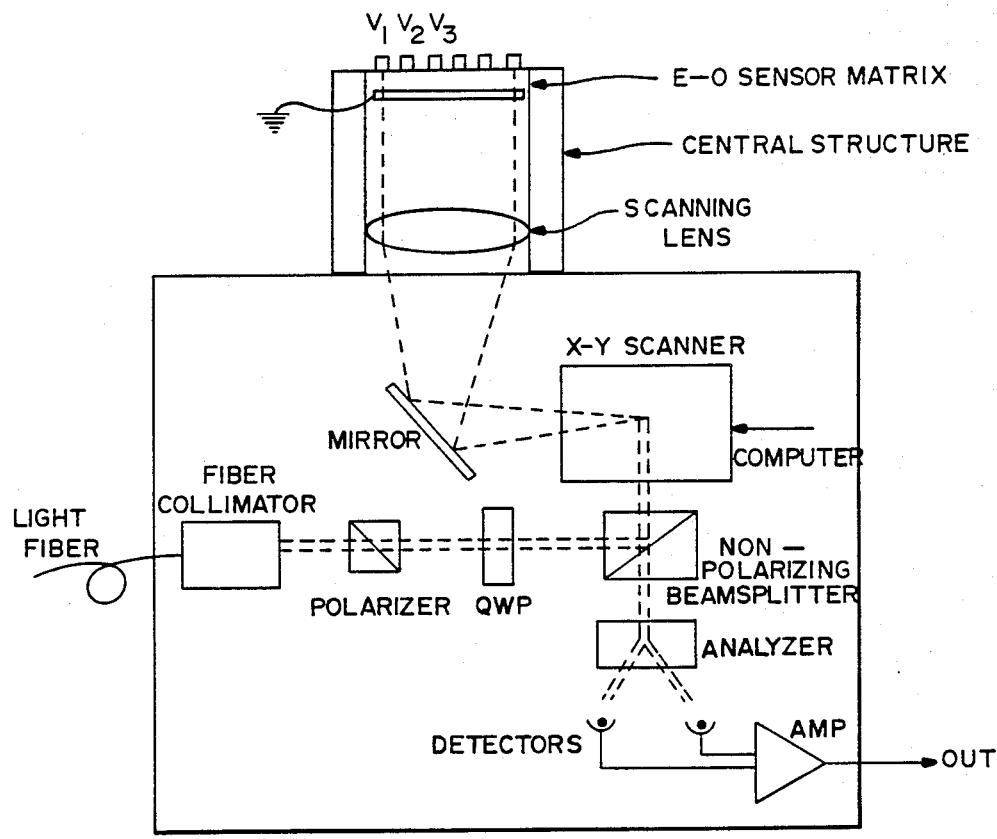
FIG.—7

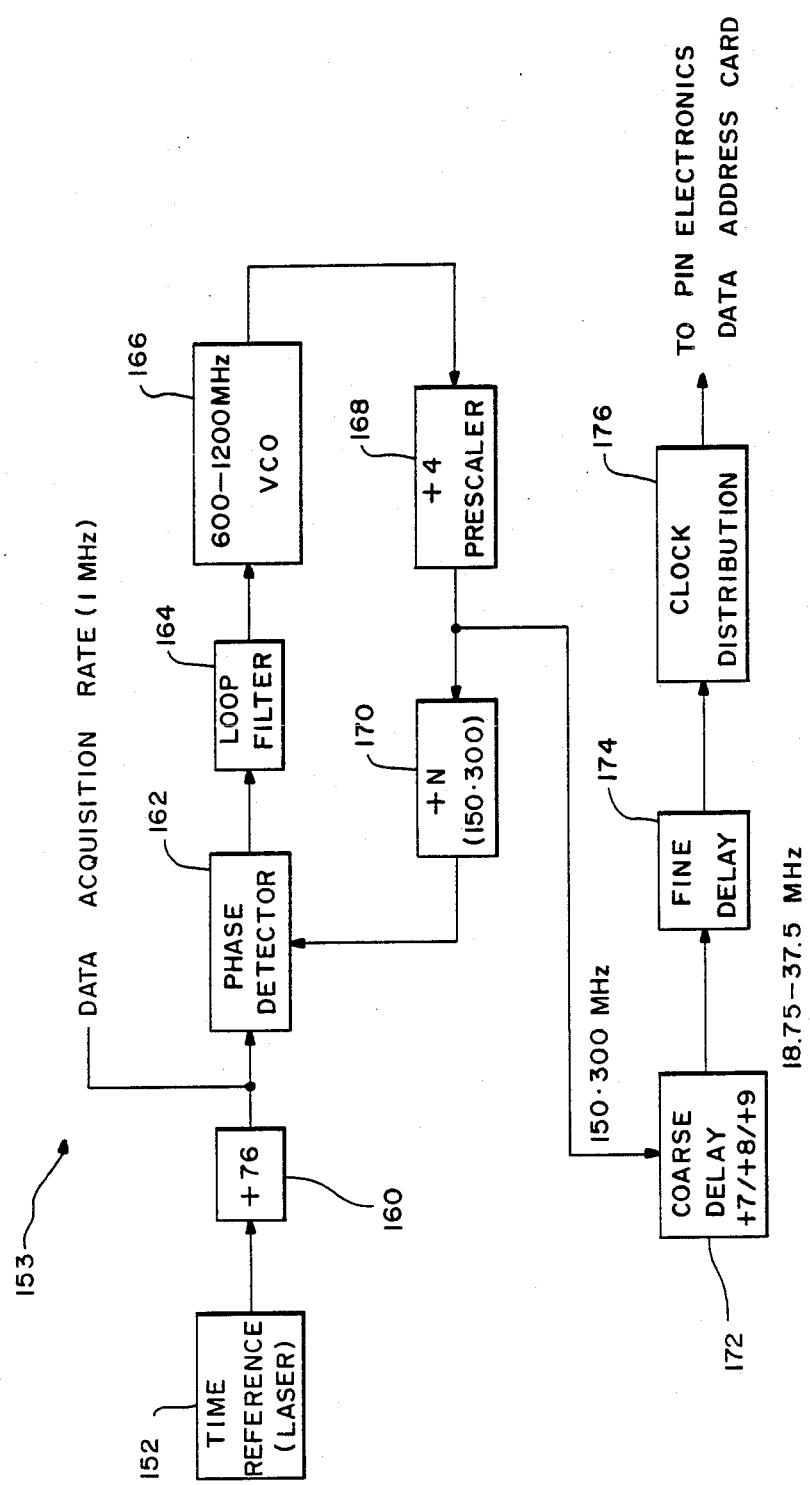
FIG.—8

ULTRA-HIGH-SPEED DIGITAL TEST SYSTEM USING ELECTRO-OPTIC SIGNAL SAMPLING

This invention is related to the following concurrently filed copending patent applications: Ser. No. 240,017, ELECTRO-OPTIC SAMPLING SYSTEM CLOCK AND STIMULUS PATTERN GENERATOR; Ser. No. 260,016, HIGH-FREQUENCY TEST HEAD USING ELECTRO-OPTICS; and Ser. No. 239,585, ELECTRO-OPTIC SAMPLING SYSTEM WITH INDIVIDUAL PULSE MEASUREMENT AND VOLTAGE CALIBRATION.

BACKGROUND OF THE INVENTION

This invention relates generally to automatic test equipment (ATE) for the testing of electronic circuits, and more particularly the invention relates to an ultra-high-speed digital test system using electro-optic signal sampling.

Conventional automatic test equipment (ATE) systems and ATE technology are inadequate to test high-speed integrated circuits including silicon bipolar emitter-coupled logic circuits, gallium arsenide circuits, and high-speed CMOS/NMOS circuits The present state of the art in test-system technology has maximum data rates running up to 200 MHz. The difficulties in raising this test rate limit are largely concentrated on the receiver technology, and measurement and signal routing which degrade the signals to the point of causing inaccuracies in the measurement system.

A high-speed conventional LSI/VLSI test system is a complex electro-mechanical assembly. The system must meet stringent requirements in throughput, pin count, voltage and time accuracy, and must be general-purpose enough to accommodate the manufacturer's present and future device types. The test system must also perform DC and AC parametrics, have flexible real-time branching "on the fly," and support many different waveform formats. Lastly, the test system must have a comprehensive software package to assist the manufacturer in developing his own test programs.

In spite of all of the above, test systems have until recently kept pace with the device requirements. At the 10 MHz clock rate and 48–64 pin requirement of over ten years ago, the manufacturers of test systems were able to cope. Even at 20 MHz and up to 120 pins (e.g. the Fairchild Sentry 20), cost-effective test systems were built. However, the push from 20 MHz to 40 or 50 MHz has been more difficult. The predominant reasons behind the difficulties in manufacturing a faster test system are technical in nature.

Accommodating all of the features of a general test system has meant substantial capacitance seen by the pin of a device under test (DUT). Present VLSI testers have pin capacitances from a low of 22 pF to 100 pF or more. This capacitance is difficult to reduce and can cause major accuracy problems in testing MOS circuits. For high-speed testing, pin capacitance is a major consideration and should be kept below 5 pF.

High pin count has caused modern ATE systems to have a large number of complex electronic assemblies placed near the DUT. A conventional test head has the necessary resources to inject complex tri-state test waveforms to the DUT, power the device, and measure its output waveforms. Because of the amount of electronics required, DUT pin-to-receiver distances are forced to be as long as 50 cm through a series of connectors. High-speed signal fidelity suffers which reduces the available bandwidth of the test system. Changing device impedances during switching also degrades total measurement performance irrespective of any controlled impedance paths to the receiver.

To eliminate reflection problems, the receiver must be placed in close proximity to the DUT within a distance corresponding to a quarter wavelength of the highest frequency of interest For a receiver bandwidth of 5 GHz into 50 ohms, for example, the maximum pin-to-receiver distance is approximately 0.5 cm, creating a very difficult mechanical and cooling problem.

Timing accuracy affects the quality of a test and is therefore a major consideration in any test system. For current ATE, timing accuracy (pin-to-pin skew) is sub-nanosecond. For example, two conventional test systems have an overall timing accuracy of 900 psec and 700 psec. Considering the large number of pins and the distances involved, this is an amazing accomplishment. For high-speed testing, however, the overall timing accuracy must be below 100 psec to maintain reasonable tester correlation and tester stability. Current test systems fall short of reaching gigahertz test requirements.

Electro-optic sampling techniques utilizing the Pockels effect have been proposed for use in ATE systems. Named after Friedrich Pockels, a German physicist who studied the phenomenon in the late 1800's, this effect is a fundamental physical inter-action between light and an electric field across an appropriate crystal. The effect causes the polarity of the light passing through the crystal to rotate proportionally to the intensity of the electric field impressed across the crystal. In other words, the crystal serves as a polarization modulator of light.

Gunn U.S. Pat. No. 3,614,451 describes a sampling system which utilizes electro-optic techniques for sampling an electrical signal. Gunn proposes the use of a travelling wave Pockels cell in which an electrical signal is propagated through a microstrip placed on a crystal exhibiting either a linear or longitudinal electro-optic effect. Light pulses are propagated through the crystal in the same general direction as the propagated electrical signal, and, due to electrically-induced birefringence, the state of polarization of the light pulses is altered according to the electrical field intensity to which the electro-optic crystal is subjected by that portion of the electrical signal travelling coincidentally along the transmission line structure.

As disclosed by Yarif, *Quantum Electronics,* John Wiley & Sons, 1967, 1975, the modulation of optical radiation in both longitudinal and transverse modes of modulation are well known. Valdmanis et al. U.S. Pat. No. 4,446,425 discloses an electro-optic sampling system similar to the system disclosed by Gunn but in which the modulation of the optical radiation occurs in a transverse mode. The Valdmanis et al. electro-optic sampling system utilizes a travelling-wave Pockels cell in which the light pulses propagate across the cell in a direction transverse to the propagation of the electrical signal along the travelling-wave Pockels cell.

Bloom et al. U.S. Pat. No. 4,681,449 disclose a high-speed testing circuit in which a travelling-wave Pockels cell comprising gallium arsenide is employed. Bloom et al. utilize a dual-wave picosecond optical source to simultaneously excite a gallium arsenide photodiode and to measure the birefringence induced by the gallium arsenide transmission line by the electro-optic effect.

E.G.& G. Princeton Applied Research has introduced a 350 GHz sampling oscilloscope which utilizes electro-optic sampling as previously disclosed by Valdmanis et al.

SUMMARY OF THE INVENTION

An object of the present invention is an improved ATE system using electro-optic sampling.

Another object of the invention is a test system using electro-optic sampling which is versatile in testing a variety of circuits.

Another object of the invention is an electro-optic test system in which the distances between a device under test and the optical signal sampling is reduced.

Still another object of the invention is a test system in which pin capacitance of the DUT is minimized.

Yet another object of the invention is an electro-optic sampling test system having good overall time accuracy.

Another object of the invention is a measurement system having test throughput adequate for digital production test applications.

Yet another object of the invention is a test system having a high-bandwidth, high-fidelity measurement capability and environment.

Another object of the invention is a high-frequency test system including complete system test functions such as device environment, programmable DUT power supplies, and fully automated test capabilities.

Briefly, the high-speed test system for semiconductor integrated circuits includes an adapter board for receiving a circuit for test, a plurality of driver circuits positioned around the adapter board for applying test patterns and supply voltages to the integrated circuit, and an electro-optic sensor positioned below the adapter board. Means connects the plurality of driver circuits to contacts of the circuit undergoing test and connects contacts of a circuit undergoing test to the electro-optic sensor. Laser means is provided for generating light sampling pulses, and optical means directs the light sampling pulses through the electro-optic sensor and directs reflections of the sampling pulses from the sensor to electro-optic voltage measuring means. A system control means is provided for controlling the system and includes a test signal pattern generator, a system time base generator, and data acquisition means.

More particularly, the adapter circuit board has on one surface first contacts for interfacing with a DUT and has on an opposing surface second contacts for interfacing with the electro-optic sensor. The first and second contacts are interconnected through the adapter circuit board with elastomer means interfacing the adapter circuit board with a DUT and with the electro-optic sensor.

In a preferred embodiment, the electro-optic sensor comprises a birefringent crystal material, a plurality of reflective contacts on one surface of the material, and a transparent electrode on an opposite surface, whereby optical pulses can be directed through the transparent electrode and through the birefringent material to a reflective contact and then reflected back through the birefringent material and the transparent electrode to the electro-optic voltage measurement means.

In a preferred embodiment, the system time base includes phase-locked-loop circuitry interconnected with the laser means for generating timing signals derived from the laser source.

The invention and objects and features thereof will be more readily apparent from the following detailed description and appended claims when taken with the drawing.

BRIEF DESCRIPTION OF THE DRAWING

FIG. 1 is a functional block diagram of the high-speed electro-optic test system in accordance with the invention.

FIG. 2 is a functional module block diagram further illustrating operation of the test system of FIG. 1.

FIG. 3 is a system communications block diagram.

FIG. 4 is a perspective view, partially in section, illustrating the test head in the electro-optic test system of FIG. 1.

FIGS. 5A and 5B are exploded perspective views of the interconnection of a device under test through adapter circuit means to an electro-optic sensor in the test head of FIG. 4.

FIG. 6 is a general schematic diagram of an optical sampling system.

FIG. 7 is a schematic diagram of the optical path of the test head.

FIG. 8 is a functional block diagram of a time base generator system employing a laser time reference as disclosed in copending application Ser. No. 240,017, supra.

DETAILED DESCRIPTION OF ILLUSTRATIVE EMBODIMENTS

Referring now to the drawing, FIG. 1 is a functional block diagram of the high-speed test system in accordance with the invention. The system includes a controller portion 10 and a test head portion 11. The controller portion utilizes a Sun 3/160 CPU controller 12 for controlling a test sequence. A test pattern generator 14 generates the test patterns which are connected through 16-line cable 16 to the test head. The system power supplies 18 and the device under test (DUT) power supplies 20 are located within the system controller 10.

An ND:YAG mode lock laser 22 generates continuous 80 to 100 ps pulses with 76 MHz repetition rate. The laser functions to provide a powerful source of optical sampling pulses to the test head, and the laser also provides a time reference for system time base as disclosed more fully in copending application Ser. No. 240,017, supra. A data acquisition system 24 is also provided in the system controller 10 for the storage and analysis of voltage measurements.

The test head 11 includes an adapter board 48 for receiving a circuit for test 28, and a plurality of pin driver circuits 30 receive the test pattern from generator 14 and drive the pins of the DUT during testing. To facilitate thermal stability and to enhance system accuracy, the pin drivers 30 are provided with liquid cooling 32, all as described more fully in copending application Ser. No. 240,016, supra.

An electro-optic sensor 34 is placed immediately below the DUT 28, thereby preserving the high-frequency signal to and from the DUT. Further, by locating the E/O sensor within approximately 0.5 cm from the DUT, the capacitive loading of the DUT is virtually eliminated.

Optical pulses from the YAG mode lock laser 22 are transmitted via light fiber 36 to electro-optic voltage measurement system 38. The optical pulses are transmitted from the system 38 to the E/O sensor 34 and are reflected back to the voltage measure system 38 which determines the polarization of the optical light due to the birefringent material in the E/O sensor 34.

FIG. 2 is a functional block diagram of the time reference or system time base as derived from the laser 22. Through use of phase-lock-loop circuitry which is described in more detail in copending application Ser. No. 240,017, supra, a time reference is provided to the system time base 40 which in turn controls the pattern generator 14 and the data acquisition system 24 in conjunction with control inputs from the CPU. The time base unit provides common timing information to the pattern generator, the data acquisition system and the pin electronic boards, with the timing information to the pin electronics providing time correlation between the system stimulus and response measurements. The conventional pattern generator receives test vector information from the system CPU and holds up to 32K vector information. An address card of the pattern generator provides address information to the data board. A 16-bit wide, 37.5 MHz to 75 MHz data stream from the data board is transferred to pin electronics boards. The pin electronics boards have a high-speed 16-to-1parallel-to-serial shift register; therefore, data rate from the outputs of the pin electronics drivers is up to 1200 mb/s to the DUT. The signal is sampled from the DUT at 1 MHz repetition rate using optical sampling pulses which are provided from a pulse plucker or gate 42 through the optical fiber 36. The sample data transfers to the data acquisition unit 24 through electro-optical components including photodetector 44. The collected data is then transferred to the system CPU for further data management.

FIG. 3 is a functional block diagram of the functions of the system under CPU control, with the Sun controller work station 12 interconnected through bus 44 to the various functional units under computer control.

FIG. 4 is a perspective view of the test head 11 shown partly in section to better illustrate the internal construction thereof. A DUT 28 is placed on an adapter board 48 which is interconnected with driver circuit boards 30 positioned radially around the DUT 28. The driver boards 30 plug into a test platform board 52 with the board 52 interconnected with the adapter board 48 by means of MOE ring 54. Thus, it will be appreciated that different circuits can be readily loaded into the test head and interconnected with the driver circuits by removing the MOE ring 54 and inserting or removing the DUT and replacing the adapter board, as will be described with reference to FIG. A and FIG. 5B. The mechanical test head is made compatible with existing wafer prober systems as well as the internal electro-optic test system. However, this size constrains the number of pin electronic boards to fit into the test head to 20 in this embodiment. As above noted, the modularized mechanical design of the DUT environmental mechanism provides easy removal of the DUT adapter board and the DUT from the test head while the high-frequency DUT environment is preserved on the system. For IC handler integration with the test system for use with volume production, the DUT is mounted on the top of the test head for easy access. Thus, the entire top interface area is dedicated to the docking of an IC handler unit. The test head also provides a stable optical platform for the electro-optic receiver system. A one-piece steel structure is provided for the optical platform which is isolated from outside test head structure, thereby providing low mechanical vibration levels to minimize any external signal noise. Further, thermal excursion of the gallium arsenide pin drivers is minimized using a liquid cooling mechanism implemented in the pin electronic boards.

Cable 16 and optical fiber 36 are interconnected with the test head, and the cable from pattern generator 14 is interconnected with the pin driver boards 30. The optical fiber 36 is interconnected with optical components shown generally at 58 which cause the laser pulses to scan the electro-optic sensor placed immediately below DUT 28 with reflections of the laser pulses returned to a pair of photodetectors 60 for subsequent electrical analysis. The optical components are described further with reference to FIG. 7.

FIGS. 5A and 5B are exploded perspective views of the interconnection of a device under test (FIG. 5A) and a probed wafer (FIG. 5B) with the electo-optic sensor of the test system. Referring to FIG. 5A, a DUT 28 in chip form is loaded in a socket 64 which interfaces with a DUT adapter board 66 via 4 matrix elastomers shown generally at 68. Elastomers 68 have fine ribbon wires embedded therein which interconnect the DUT 28 and the contacts on the DUT board 66. Similarly, elastomers 70 interconnect contacts on the bottom surface of DUT board 66 with the electro-optic sensor 72. As described above, the sensor 72 comprises a crystal of birefringent material having an array of reflective contacts 74 on the top surface, and a transparent ground contact 75 on the bottom surface. For the preservation of high-frequency signals to and from the DUT, the E/O sensor 72 is located approximately 0.5 centimeter from the DUT.

The basic principle of the test head and the electro-optic sampling is illustrated in FIG. 6. Circularly polarized light is generated by directing the output of the laser light source through an optical fiber to suitable optics, usually a linear polarizer followed by a quarter-wave plate. The light is then directed through a Pockels cell of the electro-optic sensor. The Pockels cell has the property of elliptically polarizing the light beam in an amount proportional to the field intensity present inside the crystal. This polarization change is detected on the exiting light beam by using another polarizer, called the analyzer in this configuration, and a pair of photodetectors. Circular polarization is chosen since this condition sends an equal amount of light in each photodetector and allows differential detection. The differential (x and y) signals of the photodetectors are amplified and then transmitted to the data acquisition system.

FIG. 7 is a schematic diagram of the optical path of the test head. The electro-optic sensor is the Pockels cell of the test system and is made from a single piece of electro-optic crystal. In one embodiment, the crystal has a 12×12 grid of reflective metal contacts deposited on the top surface, with each contact forming an independent voltage sense point. Each DUT pin is connected to a sensor through a matrix metal on the elastomer which connects the DUT adapter board to the sensor grid. The bottom of the sensor is coated with a transparent conductor with the grounded transparent electrode serving as the measurement reference. The sensor assembly is mounted below the DUT adapter board and is optically accessible by the laser head located at the bottom of the test head. The laser scanner sends a circular polarized laser beam to a particular sense point by positioning the laser beam with scanning mirrors and a scanning lens under control of the system computer. The scanner receives the reflected beam containing voltage information in the form of a change in the polarization of the optical pulses. The returned beam is split and analyzed using a Wollaston analyzer and the pair of photodetectors. The detectors measure the polarization changes differentially, and after the differential signal is amplified and A-D converted, the information is sent to the data acquisition system 24. The optical scanner measures each pin serially. Throughput considerations dictate minimum pin-processing rates. In one embodiment, the system will process in excess of 50 pins per second with random sampling.

By utilizing ECL and gallium arsenide technology with highly stable phase-lock-loop-per-pin architecture, the stimulus signals of the pin electronics drivers generates up to 1.2 Gb/s NRZ data rate. The bandwidth of the DUT signal path is designed to be 5 GHz. This value preserves the driver signal integrity by maintaining a flat response to the third harmonic of the 1.2 GHz of the fundamental frequency. A dielectric constant of 2.7 expanded polytetrafluoroethylene material (PTFE or Gor-Tex) is used. A lower dielectric constant is an important parameter in designing high-quality transmission lines.

The 20 high-speed input and clock signals are driven differentially on microstrip lines. The 20 low-speed signals (control bits) are driven with single-ended strip lines. The signals travel through the DUT adapter board through radial metal-on-elastomer contacts to reach the DUT board. Between the conductor pad and the DUT adapter board and the DUT pin, a set of very low impedance matrix elastomer strips is mounted on the DUT socket to provide DUT contact.

FIG. 8 shows a block diagram of a time base generator system as disclosed in co-pending application Ser. No. 240,017, supra, corresponding to the time reference of FIG. 2. The time base generator system is supplied with time reference clock pulses from a laser pulse source 152 operating at a pulse repetition frequency of 76 MHz which is detected to provide an electronic reference pulse. A reference divider circuit 160 divides the 76 MHz pulse repetition rate of the electronic reference pulses down to a 1 MHz signal. This signal is the reference frequency for a programmable phase-locked loop which includes a phase detector 162 which has one input coupled to the 1 MHz reference signal. The output error signal from the phase detector 162 is fed through a low pass loop filter 164 to the voltage control input terminal of a voltage-controlled oscillator VCO 166 which operates over a range of 600 to 1200 MHz. The output signal of the VCO is first divided by 4 in the prescaler circuit 168. The signal is then divided in a programmable divide-by-N circuit 170, where N ranges from 150 to 300, and fed to the second input of the phase detector 162.

The output of the prescaler 168 is also coupled to a coarse delay counter 172 which normally divides by 8 and which can be switched to divide by either 7 or 9. The effect of using the divide-by-7 or -by-9 is that the signal at the output of the coarse delay circuit 172 will lead or lag the reference laser sampling pulse by plus or minus one optical sampling pulse period. Time delays less than one sampling pulse period are obtained by a fine delay circuit 174 is a digitally-controlled L-C transmission delay line in which the C's are voltage-tuned varactors and which has a delay range of 7 nsecs. Using a combination of coarse and fine delays, any relative phasing between the output clock of the time generator can be obtained. The output of the time generator is at a frequency between 18.75 and 37.5 MHz which can easily be distributed through a clock distribution network 176 to the pin electronic circuits and to the data and address circuit cards.

There has been described a high-speed test system using electrical optical sampling techniques which is capable of testing the newer and faster ECL and GaAs digital integrated circuits. The unique combination of voltage-sampling opticals, digital GaAs, and interconnect technologies employed in the test system provide significant test capabilities for characterization and measurement of fast digital devices heretofore unrealized.

While the invention has been described with reference to a specific embodiment, the description is illustrative of the invention and is not to be construed as limiting the invention. For example, the electro-optic sensor has been described as using the Pockels effect, but other electro-optic sensing techniques can be employed such as, for example, multi-quantum well electro-absorption devices, charge-sensing devices, and devices employing the Franz-Keldich effect. Thus, various modifications and amplifications may occur to those skilled in the art without departing from the true spirit and scope of the invention as defined by the appended claims.

We claim:

1. A high-speed test system for semiconductor integrated circuits comprising
    an adapter board for receiving a circuit for test,
    a plurality of driver circuits positioned around said adapter board,
    an electro-optic sensor positioned below said adapter board,
    connector means connecting said plurality of driver circuits to contacts of a circuit undergoing test and for connecting contacts of a circuit undergoing test to said electro-optic sensor,
    electro-optical voltage measuring means,
    laser means for generating light sampling pulses,
    optical means for directing said light sampling pulses to said electro-optic sensor and for directing said light sampling pulses from said electro-optic sensor to said electro-optical voltage measuring means, and
    control means for controlling operation of said driver circuits, said electro-optical voltage measuring means and said optical means, said control means including a test signal pattern generator, a system time base, and data acquisition means.

2. The high-speed test system as defined by claim 1 wherein said adapter circuit board has on one surface first contacts for interfacing with a device under test and has on an opposing surface second contacts for interfacing with said electro-optic sensor, said first and second contacts being interconnected through said adapter circuit board.

3. The high-speed test system as defined by claim 2 wherein said conductor means comprises elastomer means for interfacing said adapter circuit board with a device under test and with said electro-optic sensor.

4. The high-speed test system as defined by claim 1 wherein said electro-optic sensor comprises a birefringent crystal, an array of reflective contacts on one surface of said crystal and a transparent electrode on an opposite surface of said crystal whereby optical pulses can be directed through said transparent electrode and through said crystal to a reflective contact, and the optical pulses can be reflected from the reflective contact back through said crystal and said transparent electrode to said electro-optic voltage measuring means.

5. The high-speed test system as defined by claim 4 wherein said optical means includes x-y scanner means under control of said system control means for causing said light pulses to scan said array of reflective contacts.

6. The high-speed test system as defined by claim 5 wherein said optical means further includes a light fiber connected to said laser means for receiving light pulses, collimator means connected to said light fiber for collimating the light pulses, a polarizer means for receiving and polarizing collimated pulses, means connecting the polarized pulses to the scanner means for selectively applying the polarized pulses to the array of reflective contacts, analyzer means for receiving reflected pulses, and detector means for detecting pulses passed by said analyzer means.

7. The high-speed test system as defined by claim 1 wherein said system time base includes phase-lock-loop circuitry interconnected with said laser means for generating timing signals derived from said laser means.

8. The high-speed test system as defined by claim 1 wherein said electro-optic sensor comprises a Pockels cell.

* * * * *